United States Patent [19]

Hartman et al.

[11] Patent Number: 4,608,590

[45] Date of Patent: Aug. 26, 1986

[54] HIGH VOLTAGE DIELECTRICALLY ISOLATED SOLID-STATE SWITCH

[75] Inventors: Adrian R. Hartman, New Providence, N.J.; Terence J. Riley, Wyomissing, Pa.; Peter W. Shackle, West Melborne, Fla.

[73] Assignee: AT&T Bell Laboratories, Murray Hill, N.J.

[21] Appl. No.: 333,461

[22] Filed: Dec. 22, 1981

Related U.S. Application Data

[63] Continuation of Ser. No. 248,192, Mar. 27, 1981, abandoned, Continuation-in-part of Ser. No. 107,774, Dec. 28, 1979, Continuation-in-part of Ser. No. 972,056, Dec. 20, 1978.

[51] Int. Cl.[4] .............................................. H01L 29/74
[52] U.S. Cl. ...................................... 357/38; 357/21; 357/22; 357/23.4; 357/39; 357/41; 357/49
[58] Field of Search ...................... 357/21, 22, 23, 38, 357/39, 41, 49

[56] References Cited

U.S. PATENT DOCUMENTS

| | | | |
|---|---|---|---|
| 3,417,393 | 12/1968 | Cooke | 357/21 |
| 3,657,616 | 4/1972 | Mizushima | 357/21 |
| 3,722,079 | 3/1973 | Beasom | 357/21 |
| 3,755,012 | 8/1973 | George | 357/21 |
| 3,911,463 | 10/1975 | Hull | 357/21 |
| 4,060,821 | 11/1977 | Houston et al. | 357/22 |
| 4,074,293 | 2/1978 | Kravitz | 357/34 |
| 4,146,905 | 3/1979 | Appels | 357/44 |

FOREIGN PATENT DOCUMENTS

| | | | |
|---|---|---|---|
| 2102103 | 7/1971 | Fed. Rep. of Germany | 357/22 |
| 2433981 | 2/1975 | Fed. Rep. of Germany | 357/22 |
| 1547287 | of 0000 | France | 357/38 |

OTHER PUBLICATIONS

IEEE Transactions on Electron Devices, vol. ED-23, No. 8, Aug. 1976, pp. 905-911, "A Field Terminated Diode".
IEEE International Solid State Circuits Conference, Feb. 1978, pp. 222-223, "A MOS-Controlled Triac Device".
Japanese Journal of Applied Physics, vol. 7, No. 12, Dec. 1968, pp. 1484-1490, "Threshold Current Density and Power Saturation in Read Diode".
IBM Technical Disclosure Bulletin, vol. 8, No. 11, Apr. 1966, pp. 1688-1689, "Encapsulation for Semiconductor Devices".

*Primary Examiner*—Edward J. Wojciechowicz
*Attorney, Agent, or Firm*—David I. Caplan

[57] ABSTRACT

A high voltage solid-state switch, which provides bidirectional blocking, consists of a first p− type semiconductor body separated from a support member (semiconductor substrate) by a dielectric layer with a p+ type anode region located at one end of the semiconductor body, an n+ type cathode region located at the other end, and an n+ type gate region located between the anode and cathode regions. A second p type region of higher impurity concentration than the semiconductor body surrounds the cathode region. Separate low resistance electrical contacts are made to the anode, cathode, and gate regions and to the substrate. The switch is capable of switching from an "ON" and conducting state to an "OFF" (blocking) state by adjusting the potential of the gate region and without having to adjust the potential of the anode or cathode regions.

7 Claims, 8 Drawing Figures

HIGH VOLTAGE DIELECTRICALLY ISOLATED SOLID-STATE SWITCH

CROSS-REFERENCE TO RELATED APPLICATIONS

This application is a continuation of our application Ser. No. 248,192, filed Mar. 27, 1981, now abandoned, which is a continuation-in-part of our application Ser. No. 107,774, filed Dec. 28, 1979 which is a continuation-in-part of our application Ser. No. 972,056, filed Dec. 20, 1978.

TECHNICAL FIELD

This invention relates to solid-state structures and, in particular, to high voltage solid-state structures useful in telephone switching systems and many other applications.

BACKGROUND OF THE INVENTION

German Pat. No. 2,102,103 discloses a field-effect diode structure having a p− type substrate with an n− type epitaxial layer grown on top of the substrate. The substrate can be replaced by an insulating material. A first p+ type anode region, a second p+ type region, and an n+ type cathode region exist within portions of the epitaxial layer and each forms a portion of a common surface of the epitaxial layer. The three regions are separated from each other by portions of the epitaxial layer. The patent states that conduction between anodes and cathode can only be interrupted by setting the anode voltage to a zero or negative level for a short period of time and by setting the gate voltage to a predetermined critical level. It is undesirable and/or impractical in many applications to have to adjust the anode voltage. Leakage in the diode is stated to cause it to switch on when it should be off. It is unclear how the suggested solution of a register helps solve this problem and whether or not such a register is a discrete component or can be integrated on the same substrate as the diode. It is also unclear how to physically and electrically isolate the diode from other components on the common substrate.

In an article entitled "A Field Terminated Diode" by Douglas E. Houston et al., published in *IEEE Transactions on Electron Devices*, Vol. ED-23, No. 8, August 1976, and in U.S. Pat. No. 4,060,821 (Douglas E. Houston et al.), issued Nov. 29, 1977, there is described a discrete solid-state high voltage switch that has a vertical geometry and which includes a region which can be pinched off to provide an "OFF" state or which can be made highly conductive with dual carrier injection to provide an "ON" state. One problem with this switch is that it is not easily manufacturable with center like switching devices on a common substrate. Another problem is that the spacing between the grids and the cathode should be small to limit the magnitude of the control grid voltage; however, this limits the useful voltage range because it decreases grid-to-cathode breakdown voltage. This limitation effectively limits the use of two of the devices with the cathode of each coupled to the anode of the other to relatively low voltages. Such a dual device structure would be useful as a high voltage bidirectional solid-state switch. An additional problem is that the base region should ideally be highly doped to avoid punch-through from the anode to the grid; however, this leads to a low voltage breakdown between anode and cathode. Widening of the base region limits the punch-through effect; however, it also increases the resistance of the device in the "ON" state.

It is desirable to have a solid-state switch which is easily integratable such that two or more switches can be simultaneously fabricated on a common substrate and wherein each switch is adapted such that one terminal thereof controls its state and each switch is capable of bilateral blocking of relatively high voltages and breaking current.

SUMMARY OF THE INVENTION

One embodiment of the present invention is a structure comprising a semiconductor body whose bulk is of one conductivity type and which has a major surface. Within the semiconductor body is a localized first region which is of the one conductivity type, and localized second and third regions which are both of the opposite conductivity type. The first, second, and third regions are spaced apart from each other, have separate electrode connections thereto, and are of relatively low resistivity compared to the bulk of the semiconductor body. Each of the three regions has a portion which forms part of the major surface of the semiconductor body. The structure is adapted to selectively facilitate substantial current flow between the first and third regions or to divert a sufficient flow of said current into the second region so as to interrupt (cut off) said current flow between the first and third regions. It is further adapted to selectively inhibit current flowing between the first and third regions. The structure is still further adapted such that selectively during operation there is a dual carrier injection. The overall geometry and impurity concentrations of the structure have been selected so as to aid in the inhibiting or interrupting of current flow between the first and third regions.

In a preferred embodiment the semiconductor body is of p− type conductivity and is isolated from a semiconductor support by a dielectric layer and a plurality of said bodies are formed in said support and are separated from each other by at least a dielectric layer. The first, second, and third regions serve as the anode, gate, and cathode, respectively, of the structure.

The structure of the present invention, when suitably designed, can be operated as a switch that is characterized by a low impedance path between anode and cathode when in the ON state and a high impedance path between anode and cathode when in the OFF (blocking) state. The potential applied to the gate region determines the state of the switch. In a preferred embodiment the semiconductor support is biased at the most positive potential used with the structure when the semiconductor body is of p− type conductivity and at the most negative potential when it is of n− type conductivity. The biased semiconductor support member serves to aid in establishing the OFF state. There is no need to adjust the potentials of the anode or the cathode to cause the switch to assume the OFF state. The switch inhibits or interrupts (cuts off) conduction between the anode and cathode when it is set to the OFF state. During the ON state, with appropriate potentials applied to the anode and cathode, there is dual carrier injection that results in the resistance between anode and cathode being relatively low.

This structure, which is to be denoted as a gated diode switch (GDS), when suitably designed, is capable in the OFF state of blocking relatively large potential differences between anode and cathode regions, independent of polarity, and is capable in the ON state of conducting relatively large amounts of current with a relatively low voltage drop between anode and cathode.

Arrays of these GDSs can be fabricated on a single integrated circuit chip together with other high voltage circuit components. The bilateral blocking characteristic of the structure facilitates its use in a bidirectional switch formed by two of the structures of the presenet invention with the cathode of each coupled to the anode of the other and the gates being coupled together.

These and other novel features and advantages of the present invention are better understood from consideration of the following detailed description taken in conjunction with the accompanying drawings.

DETAILED DESCRIPTION

Figure 1:
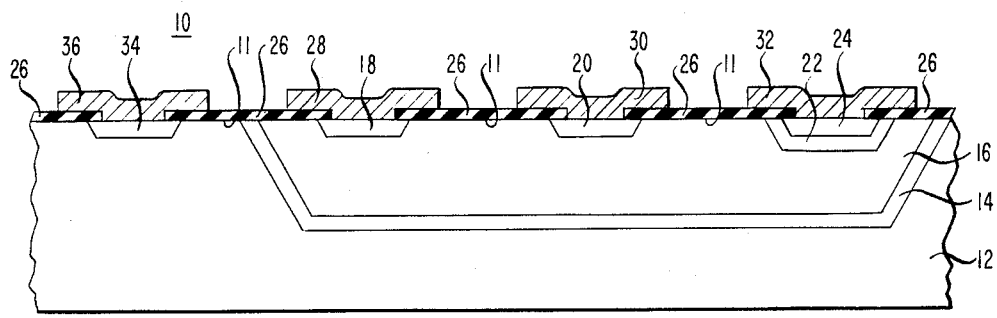
FIG. 1 illustrate a structure in accordance with one embodiment of the invention.

Referring now to FIG. 1, there is illustrated a structure 10 comprising a support member 12 having a major surface 11 and a semiconductor body 16 whose bulk is of one conductivity type and which is separated from support member 12 by an insulator layer 14, which is typically a dielectric layer. The semiconductor body 16 has a portion that is common with surface 11.

A localized first anode region 18, which is of the one type conductivity, is included in body 16 and has a portion thereof that extends to surface 11. A localized second gate region 20, which is of the opposite conductivity, also is included in body 16 and has a portion thereof which extends to surface 11. A localized third cathode region 24, which is of the opposite type conductivity, is included in body 16 and has a portion which extends to surface 11. A region 22, which is of the one type conductivity and has a portion which extends to surface 11, surrounds region 24 and acts as a depletion layer punch-through shield. Region 22 separates cathode region 24 from the bulk portion of semiconductor body 16. In addition it acts to inhibit inversion of the portions of body 16 at or near surface 11 between regions 20 and 24. It also acts to increase the voltage blocking capability between gate region 20 and cathode region 24. Gate region 20 exists between anode region 18 and region 22 and is separated from both by bulk portions of body 16. The resistivities of regions 18, 20, and 24 are low compared to that of the bulk portions of body 16. The resistivity of region 22 is intermediate between that of anode region 18 and that of the bulk portions of body 16.

Electrodes 28, 30, and 32 are conductors which make low resistance contact to the surface portions of regions 18, 20, and 24, respectively. A dielectric layer 26 covers major surface 11 so as to isolate electrodes 28, 30, and 32 from all regions other than those intended to be electrically contacted. An electrode 36 provides a low resistance contact to support 12 by way of a highly doped region 34 which is of the same conductivity type as support 12.

Advantageously, the support 12 and the body 16 are each of silicon and the support 12 may be either of n or p type conductivity. Each of electrodes 28, 30, and 32 advantageously overlaps the semiconductor region to which they make low resistance contact. Electrode 32 also overlaps region 22. This overlapping, which is known as field plating, facilitates high voltage operation because it increases the voltage at which breakdown occurs.

In one illustrative embodiment, substrate 12 and body 16 and regions 18, 20, 22, 24, and 34 are of n, p−, p+, n+, p, n+, and n+ type conductivity, respectively. Dielectric layer 14 is silicon dioxide and electrodes 28, 30, 32, and 36 are all aluminum.

A plurality of separate bodies 16 can be formed in a common support 12 to provide a plurality of switches.

Structure 10 is typically operated as a switch which is characterized by a low impedance path between anode region 18 and cathode region 24 when in the ON state and as a high impedance between said two regions when in the OFF (blocking) state. The type of structure described herein is denoted as gate diode switch (GDS). Substrate 12 is typically held at the most positive potential level available when body 16 is of p− type conductivity. It is held at the most negative potential level available when body 16 is of n− type conductivity. With operating potentials applied to the regions 18 and 24, the potential applied to gate region 20 determines the state of the switch. Regions 18 and 24 serve as the anode and cathode regions, respectively, when semiconductor body 16 is of p− type conductivity. Regions 18 and 24 serve as the cathode and anode regions, respectively, when semiconductor body 16 is of n− type conductivity.

With body 16 being of p− type conductivity, conduction between anode region 18 and cathode region 24 is inhibited or interrupted (cut off) if the potential of gate region 20 is sufficiently more positive than that of anode region 18, cathode region 24, and region 22. The amount of excess positive potential needed to inhibit or interrupt (cut off) conduction is a function of the geometry and impurity concentration (doping) levels of structure 10. This positive gate potential causes a vertical cross-sectional portion of body 16 between gate region 20 and the portion of dielectric layer 14 therebelow to be depleted and the potential of this portion of body 16 to be greater in magnitude than that of anode region 18, cathode region 24, and region 22. This essentially pinches off body 16 against dielectric layer 14 in the bulk portion thereof below gate region 20 and extending down to dielectric layer 14. The positive potential barrier of the aforesaid portion of body 16 is a potential which inhibits conduction of holes from anode region 18 to cathode region 24. If conduction exists between anode region 18 and cathode region 24 before the potential of the gate region 20 is raised to the high potential level, then gate region 20 serves to collect electrons emitted at cathode region 24 before they can reach anode region 18. This serves to help interrupt conduction between anode region 18 and cathode region 24. In addition, the high level potential of gate region 20 serves to cause a vertical cross-sectional portion of body 16 between gate region 20 and the portion of dielectric layer 14 therebelow to be depleted and the potential of this portion of body 16 to be greater in magnitude than that of anode region 18, cathode region 24, and region 22. The blocking (essentially nonconducting) state, is the OFF state. The geometry and impurity concentrations of structure 10 are designed to help inhibit or interrupt current flow between anode region 18 and cathode region 24.

The voltage applied to semiconductor support 12 causes an electric field which extends through dielectric layer 14 and into semiconductor body 16. Normally, during the ON state, electrons coat the bottom of semiconductor body 16 and act to shield it from the effect of the positive bias applied to substrate 12. With structure 10 biased to the OFF state, these electrons are removed from the bottom of semiconductor body 16 and drawn into gate region 20. This field tends to cause depletion of semiconductor body 16 and also helps cause the potential of the portion of the bulk portion of body 16 between gate region 20 and extending down to dielectric layer 14 to be greater in potential than anode region 18. The biased substrate 12 thus acts as a second or back gate which aids in switching structure 10 to the OFF state. Control circuitry capable of supplying the needed gate potentials and absorbing the electrons is illustrated and described in U.S. patent application Ser. No. 248,206, filed May 27, 1981 (A. R. Hartman-T. J. Riley-P. W. Shackle), which is being filed concurrently with this application and which has a common assignee.

With semiconductor body 16 being of p− type conductivity, conduction from anode region 18 to cathode region 24 occurs if region 18 is forward-biased with respect to region 24 and the potential of gate region 20 is below a level which inhibits or interrupts conduction between anode region 18 and cathode region 24. During the ON state holes are injected into body 16 from anode region 18 and electrons are injected into body 16 from cathode region 24. These holes and electrons can be in sufficient numbers to form a plasma which conductivity modulates body 16. This effectively lowers the resistance of body 16 such that the resistance between anode region 18 and cathode region 24 is relatively low when structure 10 is operating in the ON state. This type of operation is denoted as dual carrier injection. Positively biased substrate 12 creates an electrical field which passes through the dielectric layer 14 and tends to deplete the bulk portion of body 16. Electrons emitted from cathode region 24 coat the bottom of body 16 and thus act to shield the effect of the electrical field created by biased substrate 12. These electrons invert the bottom of the bulk portion of body 16 which is adjacent dielectric layer 14. This limits the effect of biased substrate 12 and thus allows conduction between anode region 18 and cathode region 24.

Region 22 helps limit the punch-through of a depletion layer formed during operation between gate region 20 and cathode region 24 and helps inhibit formation of a surface inversion layer between these two regions. In addition, it facilitates gate region 20 and cathode region 24 being relatively closely spaced apart. This facilitates relatively low resistance between anode region 18 and cathode region 24 during the ON state. It also serves to increase maximum operating voltage and to reduce leakage currents.

During the ON state of structure 10, the junction diode comprising semiconductor body 16 and gate region 20 can become foward-biased. Current limiting means (not illustrated) are normally included to limit the conduction through the forward-biased diode. One example of such current limiting means is illustrated and described in U.S. patent application Ser. No. 248,206 (A. R. Hartman et al Case 27-20-32).

The ON state can be achieved by having the potential of the anode region 18 greater than that of the cathode region 24 and forward-biasing the anode region 18 with respect to the gate region 20. Typically, 1–10 microamperes are pulled out of the gate region 20 while the anode-gate junction is forward-biased to cause structure 10 to assume the ON state.

It is possible to operate structure 10 in the ON state with the potential of gate region 20 at the same or a more positive level than that of anode region 18, cathode region 24, and region 22, so long as the potential of gate region 20 is below a level which essentially completely depletes a vertical cross-sectional portion of semiconductor body 16 between anode region 18 and cathode region 24. With the gate region 20 held at such a potential level, the junction diode comprising semiconductor body 16 and gate region 20 has a zero forward biase or is reverse-biased.

Figure 2:
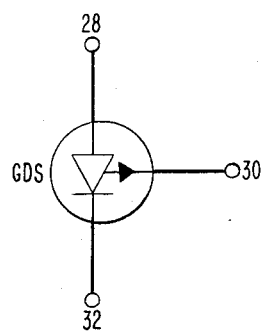
FIG. 2 illustrates a proposed electrical circuit symbol for the structure of FIG. 1.

FIG. 2 illustrates an adopted symbol for this type of switch. The anode, gate, and cathode electrodes of the GDS are denoted as terminals 28, 30, and 32, respectively.

One embodiment of the structure 10 has been fabricated with the following design. Support member 12 is an n type monocrystalline silicon substrate, 18 to 22 mils thick, with an impurity concentration of approximately $5 \times 10^{13}$ impurities/cm$^3$, and has a resistivity greater than 100 ohm-centimeter. Dielectric layer 14 is a silicon dioxide layer that is 2 to 4 microns thick. Body 16 is typically 35 to 65 microns thick, approximately 430 microns long, 300 microns wide, and is of p type conductivity with an impurity concentration in the range of approximately $5-9 \times 10^{13}$ impurities/cm$^3$. Anode region 18 is of p+ type conductivity, is typically 2 to 4 microns thick, 44 microns wide, 52 microns long, and has an impurity concentration of approximately $10^{19}$ impurities/cm$^3$. Electrode 28 is typically aluminum, with a thickness of 1½ microns, a width of 84 microns, and a length of 105 microns. Region 20 is of n+ type conductivity and is typically 2 to 30 microns thick, 15 microns wide, 300 microns long, and has an impurity concentration of approximately $10^{19}$ impurities/cm$^3$. The depth of region 20 is determined by the thickness of body 16. Electrode 30 is aluminum, 1½ microns thick, 50 microns wide, and 210 microns long. The spacing between adjacent edges of electrodes 28 and 30 and between adjacent edges of electrodes 30 and 32 is typically 40 microns in both cases. Region 22 is p type conductivity and is typically 3–6 microns thick, 64 microns wide, 60 microns long, and has an impurity concentration of approximately $10^{17}$ to $5 \times 10^{18}$ impurities/cm$^3$. Cathode region 24 is n+ type conductivity and is typically 2–4 microns thick, 48 microns wide, 44 microns long, and has an impurity concentration of approximately $10^{19}$ impurities/cm$^3$. Electrode 32 is aluminum, 1½ microns thick, 104 microns wide, and 104 microns long. The spacing between the ends of regions 18 and 22 and the respective ends of region 16 is typically 55 microns. Region 34 is n+ type conductivity and is typically 2 microns thick, 26 microns wide, 26 microns long, and has an impurity concentration of $10^{19}$ impurities/cm$^3$. Electrode 36 is aluminum which is 1½ microns thick, 26 microns wide, and 26 microns long. Insulating (dielectric) layer 26 is typically 3–5 microns thick.

Structure 10, using the parameters denoted above, has been operated as a gated diode switch (GDS) with 500 volts between anode and cathode. A layer of silicon nitride (not illustrated) was deposited by chemical vapor deposition on top of silicon dioxide layer 26 to provide a sodium barrier. Electrodes 28, 30, 32, and 36 were then formed and thereafter a coating of radio frequency plasma deposited silicon nitride (not illustrated) was applied to the entire surface of structure 10 except where electrical contact is made. The layers of silicon nitride serve to help prevent high voltage breakdown in the air between adjacent electrodes.

Typically the anode had +250 volts applied thereto, the cathode had −250 volts applied thereto, and substrate 12 had +280 volts applied thereto. These applied potentials result in the anode and cathode being essentially electrically isolated from each other and little or no current flow between anode and cathode. The −250 volts can also be applied to the anode and the +250 volts applied to the cathode without damage to structure 10. The anode and cathode remain essentially electrically isolated from each other and there is little or no current flow between anode and cathode. Thus, structure 10 bilaterally blocks voltage between anode and cathode. A potential of +280 volts applied to gate electrode 30 interrupted (broke) 350 mA of current flow between anode region 18 and cathode region 24. When the potential of the gate electrode 30 is switched from +280 volts to essentially one junction voltage drop below the potential of the anode, the GDS switches from the OFF state to the ON state. The ON resistance of the GDS with 100 mA flowing between anode and cathode is approximately 15 ohms and the voltage drop between anode and cathode is typically 2.2 volts.

Structure 10 can be used as a type of bipolar transistor with region 20 serving as the collector, region 24 serving as the emitter, and regions 18 and 22 and semiconductor body 16 serving as the base. As long as the potential applied to the collector (region 20) is below the level which inhibits or interrupts current flow between regions 18 and 24 and the base (body 16 and region 22) is forward-biased with respect to the emitter (region 24), conduction between the collector (region 20) and the emitter (region 24) occurs. Base current which supports this conduction originates from base contact region 18. If the collector voltage is increased to a level which is sufficient to cut off conduction between regions 18 and 24, then the base current from region 18 is cut off and, consequently, conduction between the collector (region 20) and the emitter (region 24) is also cut off.

It has been discovered that decreasing the impurity concentration of the bulk portion of semiconductor body 16 of structure 10 of FIG. 1 causes a modification in the mode of operation. Starting with the above design parameters, but with the impurity concentration of the bulk of semiconductor body 16 at approximately $1 \times 10^{13}$ instead of $9 \times 10^{13}$ impurities/cm$^3$, it was found that with the potential of gate region 20 at approximately the same level as anode region 18, conduction between anode region 18 and cathode region 24 is inhibited or interrupted (cut off) except for a relatively low level flow. This is the OFF (high impedance) state. With a positive bias applied to anode region 18 relative to cathode region 24, and with gate region 20 allowed to essentially electrically float in potential, substantial current flow can exist between anode region 18 and cathode region 24. This is the ON (low impedance) state. The relatively low level current flow of the OFF state helps in switching structure 10 to the ON state. Control circuitry useful to control the state of a structure 10 which has the operating characteristics described in this paragraph is described in U.S. patent application Ser. No. 248,206 (A. R. Hartman-T. J. Riley-P. W. Shackle Case 27-20-32), which is being filed concurrently with the present application and which is a continuation-in-part of U.S. patent application Ser. No. 107,771, filed Dec. 28, 1979. Ser. No. 107,771 is in itself a continuation-in-part of U.S. patent application Ser. No. 972,023, abandoned June 24, 1980.

One major advantage of structure 10, which has a semiconductor body 16 whose impurity concentration is as described immediately hereinabove, is that the gate potential need only be at that of the anode potential to switch the structure to the OFF state. It is thus not necessary to use a higher potential than exists at the anode in order to operate structure 10. Many applications require high voltage and high current switches but the most positive potential available is that applied to one of the terminals of the switch. This embodiment of structure 10 can be used in such applications so long as a limited amount of current flow can be tolerated between the anode and cathode regions when structure 10 is in the OFF state. It is, however, necessary to maintain fairly tight tolerances on the impurity concentration of semiconductor body 16 in order to operate structure 10 as indicated.

Figure 8:
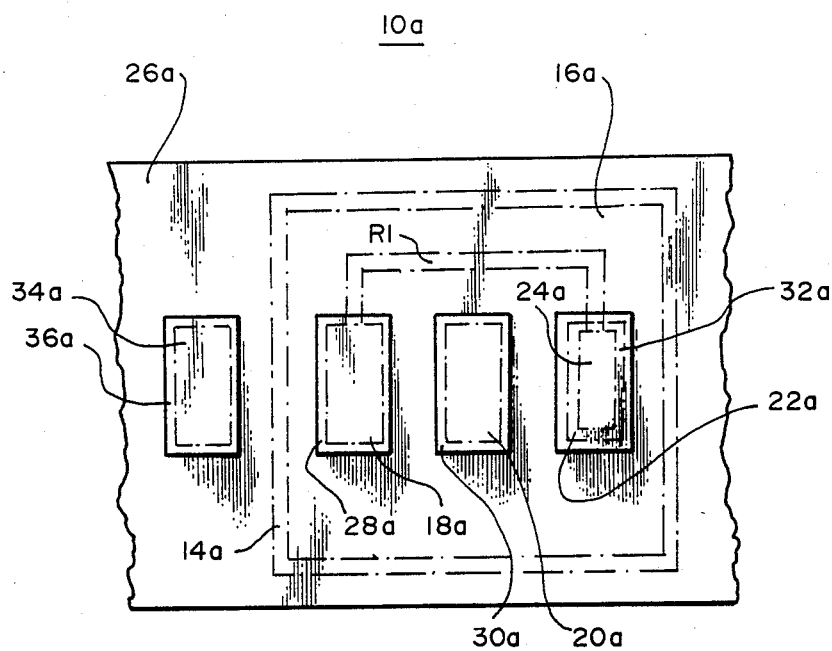
FIG. 8 illustrates a structure in accordance with still another embodiment of the invention.

Referring now to FIG. 8, there is illustrated a top view of a structure 10z which is very similar to structure 10 of FIG. 1 and all components thereof which are essentially identical or similar to structure 10 are denoted with the same reference number with the addition of an "z". The basic difference between structures 10z and 10 is the existence of a resistive-type region R1 in structure 10z which couples anode region 18z to shield region 22z. The inclusion of region R1 allows structure 10z to be operated with the maximum needed gate potential being approximately equal to the anode potential and allows for a considerably wider variation in the impurity concentration of semiconductor region 16z than is possible if R1 is not utilized. R1 serves to provide a predictable high impedance path between anode region 18z and shield region 22z. Variations in the impurity concentration of semiconductor body 16z thus become less critical since a high impedance path is established between anode region 18z and shield region 22z and this path exists relatively independent of the impurity concentration of semiconductor body 16z. Typically, the impurity concentration of semiconductor body 16z is between $2 \times 10^{12}$ impurities/cm$^3$ and $2 \times 10^{13}$ impurities/cm$^3$. R1 can be ion implanted or diffused into semiconductor body 16z. A discrete resistor could be connected between anode electrode 28z and region 22z, provided an electrode (not illustrated) is provided which is in contact with region 22z. This resistor would serve essentially the same purpose as R1. In a preferred embodiment, R1 is an ion implanted pinch type resistor and is of the same conductivity type as regions 18z and 22z. Region 22z can be eliminated in some applications. In this case R1 is extended so as to contact cathode region 24z. A discrete R1 could instead be connected to anode electrode 36z and to a p+ type contact region (not illustrated) within body 16z and located close to cathode region 24z.

Figure 3:
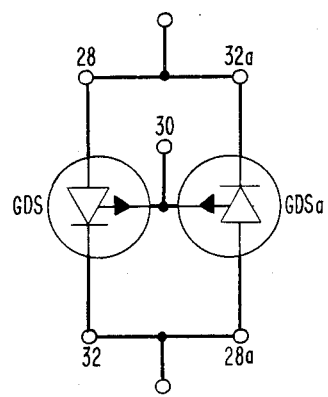
FIG. 3 illustrates a bidirectional switch circuit in accordance with another embodiment of the invention.

Referring now to FIG. 3, there is illustrated a bidirectional switch combination comprising two GDSs(GDS1 and GDS2) in accordance with the present invention with electrode 28 (the anode electrode of GDS1) electrically coupled to electrode 32a (the cathode electrode of GDS2), and electrode 32 (the cathode electrode of GDS1) electrically coupled to electrode 28a (the anode electrode of GDS2). This switch combination is capable of conducting signals from electrodes 28 and 32a to electrodes 28a and 32 or vice versa. The bilateral blocking characteristic of structure 10 facilitates this bilateral switch combination. Two separate bodies 16 can be formed in a common support 12 and the appropriate electrical connections can be made to form the above-described bidirectional switch. A plurality of separate bodies 16 can be formed in a common support 12 to form an array of switches.

Figure 4:
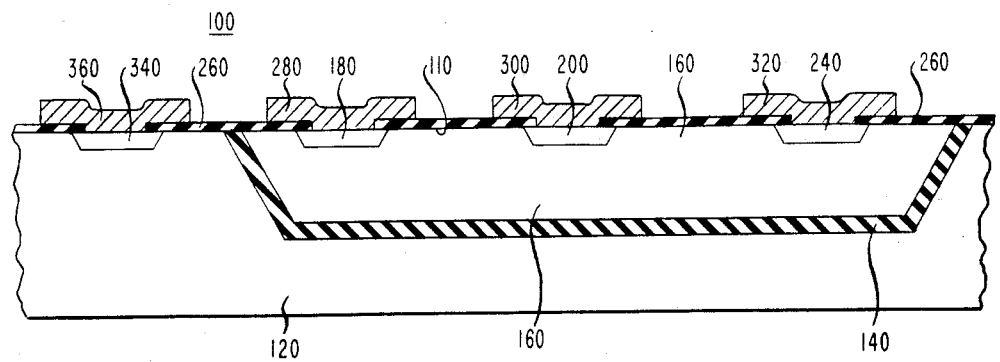
FIG. 4 illustrates a structure in accordance with another embodiment of the invention.

Referring now to FIG. 4, there is illustrated a structure 100. Structure 100 is very similar to structure 10 and all components thereof which are essentially identical or very similar to those of structure 10 are denoted by the same reference number with the addition of one "0" at the end. The basic difference between structures 100 and 10 is the elimination from structure 100 of a semiconductor region like region 22 of FIG. 1. Appropriately increasing the spacing of region 240 from region 200 provides sufficient protection against depletion layer punch-through to region 240 and facilitates the use of structure 100 as a high voltage switch.

Figure 5:
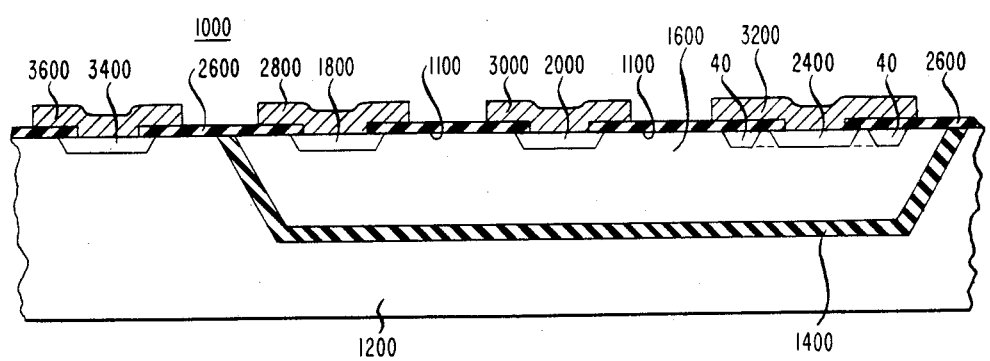
FIG. 5 illustrates a structure in accordance with still another embodiment of the invention.

Referring now to FIG. 5, there is illustrated a structure 1000. Structure 1000 is very similar to structure 10 and all components thereof which are essentially identical or similar to those of structure 10 are denoted by the same reference number with the addition of two "0s" at the end. The basic difference between structures 1000 and 10 is the use of a semiconductor guard ring region 40 encircling region 2400 and being separated therefrom by portions of region 1600. In addition, there is no equivalent of a semiconductor region like region 22 of FIG. 1. Guard ring 40 provides protection against inversion of body 1600, particularly between gate region 2000 and cathode region 2400. Guard ring 40 is of the same conductivity as body 1600 but of lower resistivity. The protection afforded is adequate in particular instances. As is illustrated by the dashed lines, region 40 can be extended so as to contact region 2400. Typically the impurity concentration of region 40 is $10^{18}$ to $10^{19}$ impurities/cm$^3$.

Figure 6:
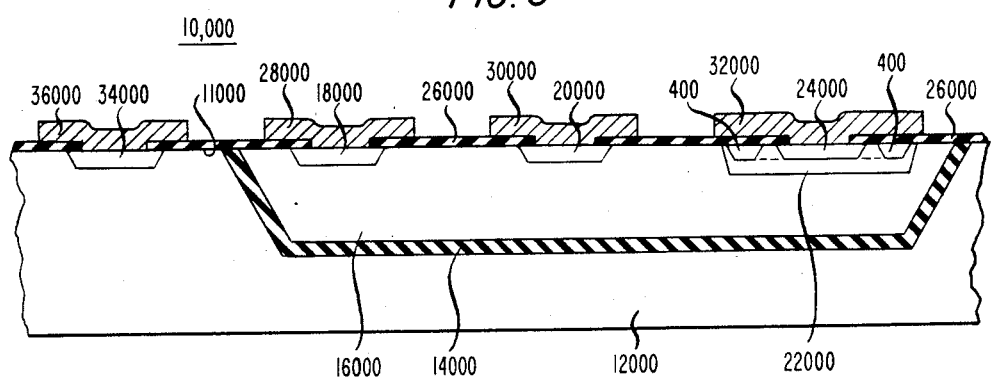
FIG. 6 illustrates a structure in accordance with still another embodiment of the invention.

Referring now to FIG. 6, there is illustrated a structure 10,000. Structure 10,000 is very similar to structure 10 and all components which are essentially the same or very similar are denoted by the same reference number with the addition of three "0s" at the end. The main difference between structure 10,000 and structure 10 is the use of a semiconductor guard ring region 400 which encircles cathode region 2400. Guard ring 400 is similar to guard ring region 40 of structure 1000 of FIG. 5. The dashed line portion of guard ring 400 illustrates that it can be extended so as to contact cathode region 24,000. The combination of region 22,000 and guard ring 400 provides protection against inversion of portions of region 16,000 at or near surface 11,000, particularly between gate region 20,000 and cathode region 24,000, and provides protection against depletion layer punch-through to cathode region 2400. Guard ring 400 is of the same conductivity as region 22,000, but is of lower resistivity. This type of dual protection structure encircling cathode region 24,000 is the preferred protection structure.

Figure 7:
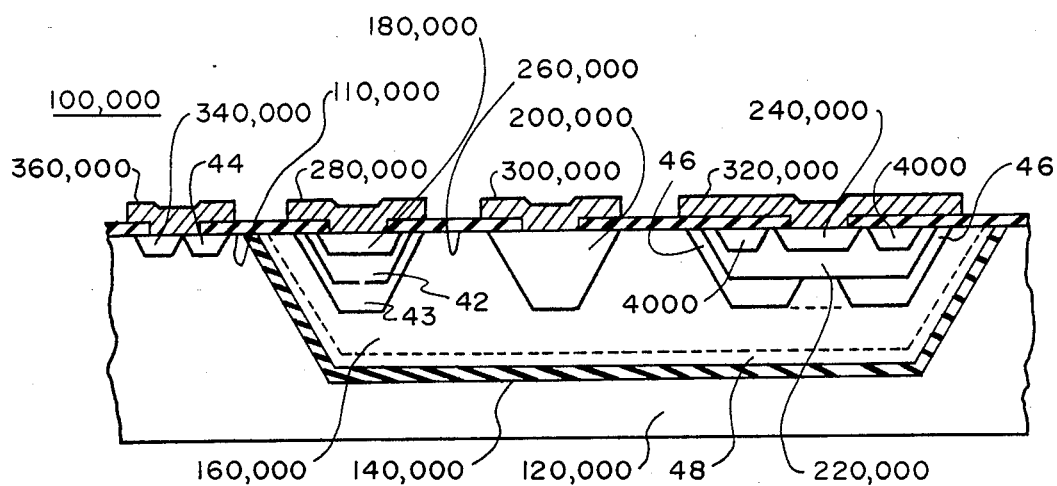
FIG. 7 illustrates a structure in accordance with one preferred embodiment of the invention.

Referring now to FIG. 7, there is illustrated a preferred embodiment of the invention comprising a structure 100,000. Structure 100,000 is similar to structure 10,000 of FIG. 6 and all components which are essentially the same or very similar are denoted by the same reference number with the addition of an extra "0" at the end. There are basically five differences between the two structures. The first difference is a semiconductor region 42 encircling anode region 180,000. The second difference is region 43 which surrounds region 42. The third difference is a ring-like region 46 encircling region 220,000. The dashed line portion of region 46 indicates that region 46 can extend all around the bottom of cathode region 240,000. Regions 42, 43, and 46 are each of the same conductivity type as the region each encircles, are of higher resistivity than the encircled regions, and are of lower resistivity than semiconductor body 160,000. Regions 43 and 46 are believed to increase the operating voltage range of structure 100,000. The fourth difference is a semiconductor region 44 in semiconductor support member (substrate) 120,000. Region 44 is of the opposite conductivity type of semiconductor region 340,000 and is of relatively low resistivity. Region 340,000 is likewise of low resistivity. Electrical contact 360,000 makes low resistance contact to regions 44 and 340,000. By having both regions 44 and 340,000, it is possible to allow semiconductor support (substrate) 120,000 to be of p or n type conductivity and to still have good ohmic contact thereto. A fifth difference is a layer 48 of semiconductor material having the same conductivity type as gate region 200,000, but being of higher resistivity than gate region 200,000, and being sandwiched between semiconductor body 160,000 and dielectric layer 140,000. Structure 100,000 was designed without a layer 48. Layer 48 is illustrated in a dashed line because it was found in many but not all of devices that were fabricated. Accordingly, structure 100,000 does not require a layer 48, but it is now part of the preferred embodiment of structure 100,000.

A structure which was explicitly designed to have a layer like layer 48 is illustrated and described in U.S. patent application Ser. No. 972,021, filed Dec. 20, 1978, and is a continuation-in-part application thereof which is U.S. patent application Ser. No. 107,772, filed Dec. 28, 1979.

One embodiment of structure 100,000 has been fabricated with 16 dielectrically separated switches on a single nominally undoped silicon support member (substrate) 120,000 which is 19 to 21 mils thick. Dielectric layer 140,000 is a silicon dioxide layer that is 3 to 4 microns thick. Body 160,000 is typically 44 to 64 microns thick, approximately 420 microns long, 300 microns wide, and is of p− type conductivity with an impurity concentration in the range of approximately $5-9 \times 10^{13}$ impurities/cm$^3$. Layer 48, when it exists, is of n type conductivity with an impurity concentration in the range of $5 \times 10^{13}$ to $9 \times 10^{14}$ impurities/cm$^3$ and a thickness of approximately 5 to 12 microns. Anode region 180,000 is of p+ type conductivity and is typically 2 to 4 microns thick, 24 microns wide, 145 microns long, and has an impurity concentration of approximately $10^{19}$ impurities/cm$^3$. Region 42 is of p type conductivity, is typically 3-4 microns thick, 31 microns wide, 152 microns long, and has an impurity concentration of approximately $10^{18}$ impurities/cm$^3$. Region 43 is of p type conductivity, is typically 15 microns thick, 90 microns wide, 211 microns long, and has an impurity concentration of approximately $10^{15}$ impurities/cm$^3$. Electrode 280,000 is typically aluminum, with a thickness of 1½ microns, a width of 74 microns, and a length of 195 microns. Gate region 200,000 is of n+ type conductivity and is typically 15 microns thick, 40 microns wide, 300 microns long, and has an impurity concentration of approximately $5 \times 10^{19}$ impurities/cm$^3$. Region 44 is of p+ type conductivity and is typically 2 microns thick, 15 microns wide, 15 microns long, and has an impurity concentration of approximately $10^{19}$ impurities/cm$^3$. Electrode 300,000 is typically aluminum, 1½ microns thick, 50 microns wide, and 320 microns long. The spacing between adjacent edges of electrodes 280,000 and 300,000 and between 300,000 and 320,000 is 40 microns in both cases. Cathode region 240,000 is of n+ type conductivity and is typically 1½ microns thick, 33 microns wide, 99 microns long, and has an impurity concentration of approximately $5 \times 10^{19}$ impurities/cm$^3$. Guard ring region 4000, which surrounds cathode region 240,000, is of p+ type conductivity and is 2 microns deep, has an inner diameter along surface 110,000 of approximately 45 microns and an outer diameter of approximately 71 microns, and an impurity concentration of approximately $10^{19}$ impurities/cm$^3$. The spacing between guard ring 4000 and cathode region 240,000 is approximately 6 microns. Region 220,000 is of p type conductivity, 79 microns wide, 145 microns long, 3 to 4 microns thick, and has an impurity concentration of $10^{18}$ impurities/cm$^3$. Region 46 is of p type conductivity, is 130 microns wide at the outer periphery, approximately 9 microns wide at the inner periphery (the distance between the sidewalls of region 46 where they intersect region 220,000), 195 microns long at the outer periphery, 75 microns long at the inner periphery, 15 microns deep, and has an impurity concentration of $10^{15}$ impurities/cm$^3$. Electrode 320,000 is typically aluminum, with a thickness of 1½ microns, a width of 114 microns, and a length of 180 microns. Region 340,000 is of n+ type conductivity, is 15 microns wide, 15 microns long, 1½ microns deep, and has an impurity concentration of approximately $5 \times 10^{19}$ impurities/cm$^3$. Electrode 360,000 is typically aluminum, with a thickness of 1½ microns, a width of 15 microns, and a length of 30 microns. The distance between the edge of region 42 and the edge of semiconductor body 160,000 is typically 42 microns. The distance between the edge of region 46 and semiconductor body 160,000 is typically 49.5 microns. Insulating (dielectric) layer 260,000 is silicon dioxide of a thickness of 3–5 microns.

The embodiments described herein are intended to be illustrative of the general principles of the invention. Various modifications are possible consistent with the spirit of the invention. For example, for the designs described, support members 12, 120, 1200, and 12,000 can alternatively be p type conductivity silicon, gallium arsenide, sapphire, a conductor, or an electrically inactive material. If support members 12, 120, 1200, and 12,000 are electrically inactive materials, then dielectric layers 14, 140, 1400, 14,000 can be eliminated. Still further, bodies 16, 160, 1600, 16,000 can be fabricated as air isolated type structures. This allows for the elimination of support members 12, 120, 1200, and 12,000 and dielectric layers 14, 140, 1400, and 14,000. Further, the electrodes can be doped polysilicon, gold, titanium, or other types of conductors. Still further, the impurity concentration levels, spacings between different regions, and other dimensions of the regions can be adjusted to allow significantly different operating voltages and currents than are described. Additionally, other types of insulating (dielectric) materials, such as silicon nitride or Semi-Insulating Polycrystalline Oxygen Doped Silicon (SIPOS) can be substituted for silicon dioxide. Still further, the conductivity type of all regions within the dielectric layer can be reversed provided the voltage polarities are appropriately changed in the manner well known in the art. It is to be appreciated that two structures of the present invention with common gate terminals and the anode of each coupled to the cathode of the other allows alternating or direct current operation. A resistive-type region like R1 of FIG. 8 can be added between: anode region 180 and cathode region 240 of structure 100 of FIG. 4, anode region 1800 and region 40 of structure 1000 of FIG. 5, anode region 18,000 and region 22,000 of structure 10,000 of FIG. 6, and between regions 43 and 46 of structure 100,000 of FIG. 7. The addition of a region like R1 to each of these structures and the choice of an appropriate impurity concentration for the corresponding semiconductor bodies, allows these structures to be operated in a similar fashion to structure 10a of FIG. 8. Still further, a single semiconductor substrate can contain some semiconductor bodies which are of p− type conductivity and others which are of n− type conductivity. This use of n− and p− type conductivity semiconductor bodies with a common substrate is believed to be particularly useful when semiconductor layers, like layer 48 of FIG. 7, are used with all the semiconductor bodies. Layers like layer 48 could be used with just the p− type conductivity semiconductor bodies or with just the n− type conductivity semiconductor bodies. Still further, layer 48 of FIG. 7 can be of the same inparity concentration of gate region 20,000. Still further, in some applications, portions of regions 22, 40, 22,000, and 46, of FIGS. 1, 5, 6 and 7, respectively, could be extended to meet the respective gate regions.

What is claimed is:

1. A switching element comprising a semiconductor body whose bulk is of one conductivity type and relatively high resistivity and which includes anode, gate, and cathode regions spaced apart and localized along a common planar surface of the body, each being of relatively low resistivity, the cathode and gate regions being of the opposite conductivity type as the bulk and the anode region being of the same conductivity type as the bulk, and separate cathode, anode, and gate electrodes, the parameters of the various portions of the switching element being such that with the anode region being forward biased with respect to the cathode region and the potential of the gate region being insufficient to essentially completely deplete a cross-sectional portion of the bulk of the semiconductor body between the anode and cathode regions there is facilitated a substantial current flow between the anode and cathode regions via the bulk, and with the anode region being forward biased with respect to the cathode region and the potential of the gate region being of sufficiently greater magnitude than that of the anode region to essentially completely deplete a cross-sectional portion of the bulk of the semiconductor body between the anode and cathode regions and to cause this portion of the bulk of the semiconductor body to be at a potential which is greater in magnitude than the anode region, there is facilitated an inhibiting or interrupting (cutting off) of current flow between the anode and cathode regions.

2. A switching element in accordance with claim 1 in which the gate region is localized on the common surface intermediate between the cathode and anode regions.

3. A switching element in accordance with claim 1 further comprising:
   a semiconductor region within the semiconductor body and being of the same conductivity type as the bulk but of lower resistivity; and
   the semiconductor region surrounds the cathode region so as to separate the cathode region from the bulk portion of the semiconductor body.

4. A plurality of switching elements in accordance with claim 1 with each included in a common support member and being isolated from one another and from the support member by an insulating layer(s).

5. The switching elements of claim 4 wherein the support member is a semiconductor support member and the insulating layer(s) is silicon dioxide.

6. A pair of switching elements each in accordance with claim 1 with the gate electrodes of the pair connected to one another and the anode electrode of each connected to the cathode electrode of the other to provide a bilateral switch.

7. A switching element comprising a semiconductor body whose bulk is of one conductivity type and relatively high resistivity and which includes anode, gate, and cathode regions spaced apart and localized along a common planar surface of the body, each being of relatively low resistivity, the cathode and gate regions being of the opposite conductivity type as the bulk and the anode region being of the same conductivity type as the bulk, and separate cathode, anode, and gate electrodes, the semiconductor body being separated from a semiconductor support member by a dielectric layer, the semiconductor support member having a separate electrode coupled thereto which is adapted to be held at the most positive potential used with the switching element if the gate region is of n+ type conductivity, and at the most negative potential used with the switching element if the gate region is of p+ type conductivity, the parameters of the various portions of the structure being such that with the anode region being forward biased with respect to the cathode region and the potential of the gate region being insufficient to deplete a cross-sectional portion of the bulk of the semiconductor body between the anode and cathode regions there is facilitated a substantial current flow between the anode and cathode regions via the bulk, and with the anode region being forward biased with respect to the cathode region and the potential of the gate region being of a sufficient magnitude relative to the anode region to deplete the portion of the bulk of the semiconductor body between the anode and cathode regions and to cause this portion of the bulk of the semiconductor body to be at a potential which is greater in magnitude than the anode region, there is facilitated an inhibiting or interrupting (cutting off) of current flow between the anode and cathode regions.

* * * * *